(12) United States Patent
Sekihara

(10) Patent No.: US 9,612,529 B2
(45) Date of Patent: Apr. 4, 2017

(54) PELLICLE FRAME AND A PELLICLE

(71) Applicant: SHIN-ETSU CHEMICAL CO., LTD., Tokyo (JP)

(72) Inventor: Kazutoshi Sekihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 65 days.

(21) Appl. No.: 14/826,378

(22) Filed: Aug. 14, 2015

(65) Prior Publication Data

US 2016/0085147 A1    Mar. 24, 2016

(30) Foreign Application Priority Data

Sep. 22, 2014   (JP) .................................. 2014-192378

(51) Int. Cl.
  *G03F 1/64*   (2012.01)
  *G03F 1/62*   (2012.01)
(52) U.S. Cl.
  CPC ...................... *G03F 1/64* (2013.01)
(58) Field of Classification Search
  CPC ...................... G03F 1/64; G03F 1/62
  See application file for complete search history.

(56) References Cited

U.S. PATENT DOCUMENTS

2010/0328641 A1* 12/2010 Shirasaki .................. G03F 1/64
                                                                    355/75

FOREIGN PATENT DOCUMENTS

| JP | 2011-7933 A | 1/2011 |
| JP | 2011-7934 A | 1/2011 |
| JP | 2011-7935 A | 1/2011 |
| WO | 2009/008294 A1 | 1/2009 |

OTHER PUBLICATIONS

Office Action dated Dec. 19, 2016, issued in counterpart Taiwanese Application No. 104130217 (5 pages).

* cited by examiner

*Primary Examiner* — Stephen Rosasco
(74) *Attorney, Agent, or Firm* — Westerman, Hattori, Daniels & Adrian, LLP

(57) ABSTRACT

A pellicle is proposed in which the frame is formed with an external horizontal slit for the purpose of receiving a pressing means, which can urge the pellicle to be adhered to a photomask, in which the slit forms a vertically protruding part of a thickness of 5-30% of the width of a pellicle frame main body and a horizontally protruding part of a thickness of 0.3-1 mm; also the method of adhering the pellicle to the photomask is proposed.

10 Claims, 5 Drawing Sheets

PELLICLE FRAME AND A PELLICLE

The present non-provisional patent application claims priority, as per Paris Convention, from Japanese Patent Application No. 2014-192378 filed on Sep. 22, 2014, the disclosure of which is hereby incorporated by reference herein in its entirety.

FIELD OF THE INVENTION

The present invention relates to a pellicle frame as well as a pellicle having this pellicle frame, useful as a dust-fender employed in the scenes of manufacturing semiconductor devices, IC packages, printed circuit boards, liquid crystal display panels, organic EL display panels, etc.

BACKGROUND TECHNOLOGY

In manufacturing semiconductor devices such as LSI and super-LSI or in manufacturing a liquid crystal display panel or the like, a pattern is made by irradiating a ultraviolet light to a semiconductor wafer or a glass plate for liquid crystal, but if a dust particle is sticking to a photomask used in this stage, the dust particle obstructs the light or reflects it, causing deformation, short circuit or the like in the pattern being transferred, and such phenomena lead to lowering of the quality of the end products.

Thus, these works are usually performed in a clean room, but, even in a clean room, it is yet difficult to keep the photomask clean all the time; hence, the exposure light irradiation is conducted only after a surface of the photomask is sheltered by a pellicle as a dust fender. Under such circumstances, foreign particles do not directly adhere to the surface of the photomask, but only onto the pellicle membrane, and thus by setting a photo focus at a pattern on the photomask at the time of lithographing, the foreign particles on the pellicle membrane fail to transfer their shadows onto the photomask.

In general, a pellicle is built up of a pellicle frame, which is made of aluminum, a stainless steel, an engineering plastic or the like, and a transparent pellicle membrane usually made of cellulose nitrate, cellulose acetate, a fluorine-containing polymer or the like which transmit light well; this pellicle membrane is adhered to an upper one of the two annular faces of the pellicle frame.

On a lower one of the annular faces of the frame is laid an agglutinant layer made of a polybutene resin, a polyvinyl acetate resin, an acrylic resin, a silicone resin or the like for attaching the pellicle frame to the photomask, and over this agglutinant layer is laid a releasable liner (separator) for protecting the agglutinant layer.

In recent years, owing to the increased refinement of the exposure light pattern, the problem of the deformation of the photomask caused by pellicle adhesion to it has become more focused. This problem occurs as the photomask and pellicle frame are coupled together via the agglutinant layer, whereby the form of the pellicle frame affects that of the photomask, and thus the pattern described on the surface of the photomask is deformed from the original form.

Hence, a pellicle is called for that scarcely affects the shape of the photomask when it is attached thereto. Various countermeasures have been proposed to solve this problem: for example, the mask-boding agglutinant layer is made softer, or the flatness of the pellicle frame is improved. There proposed methods can reduce the effect the pellicle frame shape imparts to the photomask shape, but the result is not necessarily sufficient. This is on account of the fact that the flatness of the pellicle frame and that of the photomask are not perfect and, depending on the combinations of them the magnitude of the effect imparted by the pellicle frame shape to the photomask shape is diversified.

As is learnt from IP Publications 1 through 3, the conventional countermeasures proposed are basically designed to reduce the rigidity of the pellicle frame so as to enable the pellicle frame to readily fit and copy the shape of the photomask, through a use of a material of low rigidity such as resin or lowering the height of the pellicle frame or modifying the cross section of the frame bar (thereby reducing the cross section area).

PRIOR ART PUBLICATIONS

IP Publications

[IP Publication 1]
Japanese Patent Application Publication No. 2011-7933
[IP Publication 2]
Japanese Patent Application Publication No. 2011-7934
[IP Publication 3]
Japanese Patent Application Publication No. 2011-7935

Problems the Invention Seeks to Solve

However, in the actual manufacturing scenes, from the viewpoint of the necessity of maintaining the pellicle membrane tensed so as to prevent it from being wrinkled, while the frame itself ought to be kept from being deformed, during the stages from manufacturing through adhesion to a photomask, the pellicle frame is preferably made as rigid as possible, with a conclusion that to reduce its rigidity excessively is not acceptable on account of the problems it would cause in the manufacturing and the handling of the pellicle.

Also, although to reduce the height of the pellicle frame is an effective maneuver to improve the ability of the frame to readily fit and copy the shape of the photomask, the problem of the maneuver is that the distance between the pellicle membrane and the photomask (stand-off) becomes so small that enough defocusing effect, which is the very purpose of the pellicle, is not obtained.

Next, if the inner wall of the pellicle frame is made to have a special shape, the operation for machining the frame becomes complicated and the niches in the inner wall would liable to be a source of foreign materials and the deformation of the frame would be caused during the machining so that a consequent problems is that the flatness of the upper and lower annular faces would be difficult to maintain at high levels.

In addition to this, a further problem with these already proposed pellicle frames is that in order to attain highly reliable adhesion, a considerable load need be placed during the adhesion stage. In particular, in order to obtain a reliable adhesion of the frame to the photomask surface, the magnitude of load needed as the load is imposed on the pellicle frame to thereby press and deform the agglutinant layer so that the latter is firmly glued to the photomask is, for example in the case of a 6-inch (150-mm square) mask for semiconductor device application, 20 to 30 kgf; or in the case of a way larger mask of 1220 mm×1400 mm for liquid crystal panel application it is 200 kgf; and the problem is that the load for gluing is at such levels that such load would not fail to deform the photomask.

Consequently, the pellicle that is currently called for in particular is such one that has a frame which can maintain a suitable frame rigidity while giving rise to little problem during their manufacturing and service times, and which can maintain a sufficiently high stand-off and can be glued to the photomask with relatively small load, and one which induces scarce deformation in the photomask after its adhesion thereto.

Hence, in view of the above-described circumstances, it is an object of the present invention to provide a pellicle with a frame which induces only very small deformation to the photomask after it is adhered thereto, while it can be manufactured and handled without difficulties.

Means to Solve the Problem

In particular, the pellicle frame of the present invention is characteristic in that it is made up of a main body, a vertically protruding part which extends vertically from that face of the main body which is opposite its pellicle membrane-receiving face, said vertically protruding part having a face flush with the inner wall face of the main body and having a thickness of 5-30% of the width of the main body, and also a horizontally protruding part which extends beneath said pellicle frame main body in parallel to the pellicle membrane-receiving face from the distal part of the vertically protruding part, said horizontally protruding part having a thickness of 0.3-1 mm.

Also, the pellicle frame of the present invention is characteristic in that the inner wall face of the pellicle frame main body, the flush-with-inner-wall face of the vertically extruding part, and an end face of the horizontally extruding part are vertical to the membrane-receiving face of the pellicle frame main body.

Furthermore, it is preferable that the distance between the horizontally protruding part and the bottom face of the pellicle frame main body is 0.3-3 mm, and that the vertically protruding part, the horizontally protruding part and the pellicle frame main body are formed monolithically.

The pellicle according to the present invention has such a pellicle frame as described above, and, preferably, a lower face of the horizontally protruding part is laid with a mask-bonding agglutinant layer whose flatness is 1 through 30 micrometers.

The pellicle according to the present invention is also characteristic in that a pressing means is inserted in the hollow formed between the horizontally protruding part and the pellicle frame main body so that the horizontally protruding part is pressed via the pressing means to be bonded to the photomask.

Effect of the Invention

According to the present invention, the mask-bonding agglutinant layer is laid on the less rigid protrusion protruding integrally from the photomask side face of the pellicle frame main body so that the mask-bonding agglutinant layer deforms responsive to the shape of the photomask whereby the effect of the shape of the pellicle frame main body can be mitigated, and thus the deformation of the photomask induced by the pellicle after its adhesion to the photomask is significantly restrained. Henceforth, it is possible to provide a pellicle frame, or a pellicle including such a frame, which induces only very small deformation to the photomask after it is adhered thereto, while it can be manufactured and handled without difficulties.

EXAMPLES TO EMBODY THE INVENTION

Here an example of embodying the present invention is explained in detail with reference to drawings, and one should not construe the invention to be limited thereto.

The present invention is particularly effective when applied to a pellicle having a side length of about 150 mm, like the ones used in a semiconductor manufacturing line, where the deformation of the photomask is particularly detested; but the present invention is also applicable to larger pellicles such as ones having a side length of 200-300 mm for print substrate and ones having a side length of 500-2000 mm for liquid crystal panel and organic EL display panel; in fact the present invention can work for any pellicle where deformation of the photomask is caused as the pellicle is bonded to the photomask.

Figure 1:
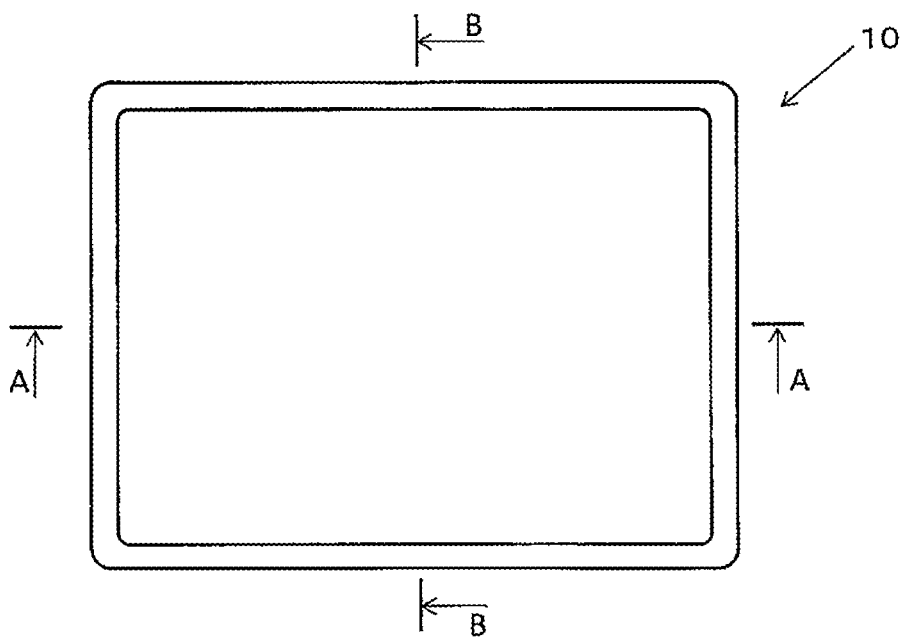
FIG. 1 A plan view of a pellicle frame of the present invention.
Figure 2:
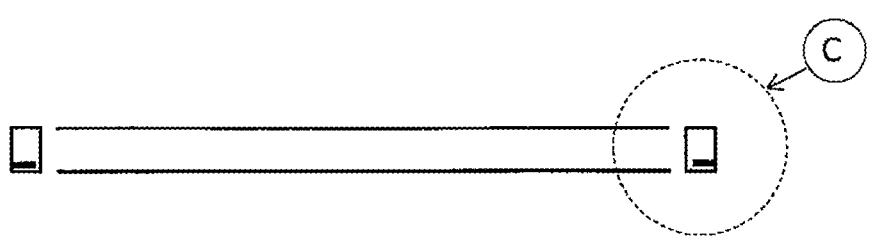
FIG. 2 A cross section taken across a plane indicated by A-A in FIG. 1 showing a pellicle of the present invention.
Figure 3:
FIG. 3 A cross section taken across a plane indicated by B-B in FIG. 1 showing a pellicle of the present invention.
Figure 4:
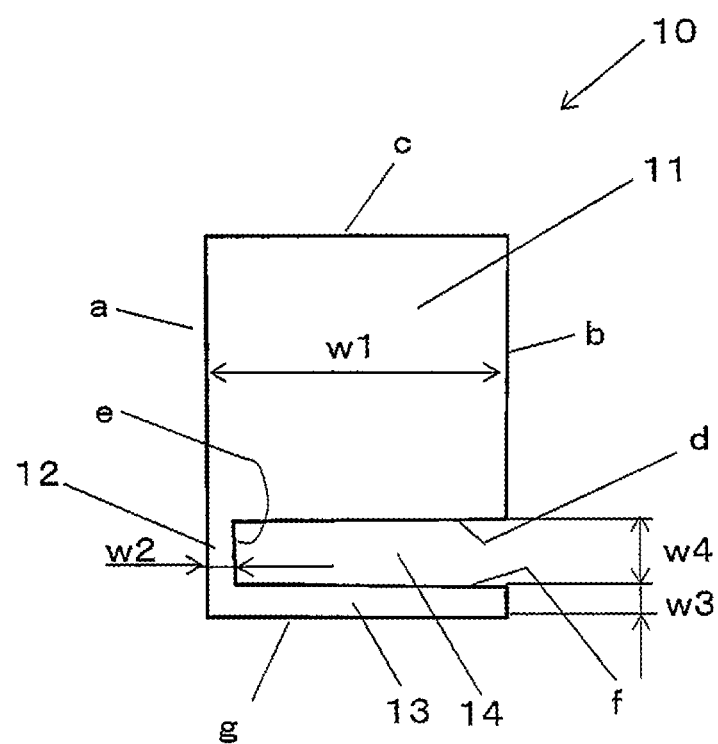
FIG. 4 A magnified view of part C of FIG. 2 showing a pellicle frame of the present invention.

FIGS. 1 through 4 shows one embodiment of the pellicle frame according to the present invention. FIG. 1 is a plan view of it, FIG. 2 is a cross section taken across the plane indicated by A-A in FIG. 1. FIG. 3 is a cross section taken across the plane indicated by B-B in FIG. 1, and FIG. 4 is a magnified view of part C of FIG. 2.

According to the present invention, as shown in FIG. 4, the vertically protruding part 12 is provided, which extends vertically, toward a photomask meeting side, from a face d of the main body 11 of a framed pellicle frame 10 that is opposite the face c thereof to which the pellicle membrane 53 is tensely bonded, said vertically protruding part 12 having a face flush with the inner wall face a of the pellicle frame 11. And also the horizontally protruding part 13 is provided, which extends from the distal part of the vertically protruding part 12 toward the plane including the outer wall face b of the pellicle frame 11. Mask-bonding agglutinant layer is laid on a face g of this horizontally protruding part 13. FIG. 4 shows a cross section of a shorter frame bar of the pellicle frame 10, and basically it is desirable that the same structure is adopted along the longer frame bars and corners; however, if need be, it is possible to modify the structure partially.

Now, the smaller is the width w2 of the vertically protruding part 12, the smaller the effect imparted to the shape of the photomask will be; however, owing to the fact that insufficiency of the width w2 would cause a damage such as cracking which would create dust particles at the time of machining, it is preferable that the width w2 is 5-30% of the width w1 of the main body of the pellicle frame. As for the width w1 of the main body of the pellicle frame, it is usually in the range of 1.5 to 20 mm, depending on the size of the pellicle.

The smaller is the width w3 of the horizontally protruding part 13, the smaller the effect imparted to the photomask will be and also the smaller the load required for the adhesion of the pellicle frame to the photomask will be; however, from the viewpoint of securing flatness of the frame, the width w3 is preferably in a range of 0.3-1 mm.

Next, the width w4 of the hollow 14 formed between the horizontally protruding part 13 and the lower face d of the pellicle frame main body 11 (namely the length of the vertically protruding part 12) is preferably 0.3-3 mm, for the purposes of securing sufficient rigidity in the vertically protruding part 12 and of accommodating for the insertion therein of the pressing means at the time of adhesion of the pellicle to the photomask, which will be described later.

The shapes of the faces d, e and f are preferably plane as indicated in FIG. 4, but it is possible to modify one or more of the faces to depart from planarity to have a slanted or curved portion if such is convenient in view of workability. Only in the case of the face f, it is preferably parallel to the mask-bonding agglutinant receiving face g so as to facilitate smooth pressure application at the time of pellicle adhesion to the photomask.

It is possible to make this vertically protruding part 12 and the horizontally protruding part 13 independently from the pellicle frame main body 11, and thereafter combine them all into one body. However, for the sake of better productivity, reliability, and prevention of foreign particle generation, it is particularly preferable that these protruding parts 12, 13 are carved out by machine tooling means from the pellicle frame main body 11 so as to create a seamless one body altogether of the three.

The pellicle frame main body 11 and the protruding parts 12, 13 may be made of any conventionally used materials including an aluminum alloy, a steel, a stainless steel, an engineering plastic such as PE, PA and PEEK, a fiber composite such as GFRP and CFRP. It is also possible to make the vertically protruding part 12 and the horizontally protruding part 13 of a material different from the material of which the pellicle frame main body 11 is made, and they can be made of a less rigid material such as a resin.

Further, the surfaces of the pellicle frame main body 11 and the protruding parts 12, 13 are preferably treated to have a black appearance, and depending on the necessity it is preferable that their surfaces are coated for prevention of dust generation. For example, if a frame is of an aluminum alloy, it is preferable that the surface is anodized with alumite treatment or passivation treatment, and if it is of a steel or a stainless steel, a plating such a black chrome plating is recommended.

The overall height of a pellicle is strictly determined by a specification of the exposure apparatus to which it is applied, but the area of the cross section of the pellicle frame main body 11 may be determined in consideration of the rigidity required against the tensile strength of the pellicle membrane as well as the strength required during the pellicle frame manufacturing and handling. Therefore, the longer are the pellicle frame bars the greater the required area of the pellicle frame cross section will be. Roughly speaking, if the length of a frame bar is 150 mm or so, the cross section of the bar ought to be at least as large as 5 $mm^2$; similarly if the bar length is 500 mm or greater its cross section ought to be at least 30 $mm^2$; if the bar length is 1000 mm or greater its cross section ought to be at least 50 $mm^2$; or if the bar length is 1500 mm or greater its cross section ought to be at least 70 $mm^2$. Of course it is acceptable that the width (cross sectional area) of the longer bars of the frame is different from that of the shorter ones.

Figure 5:
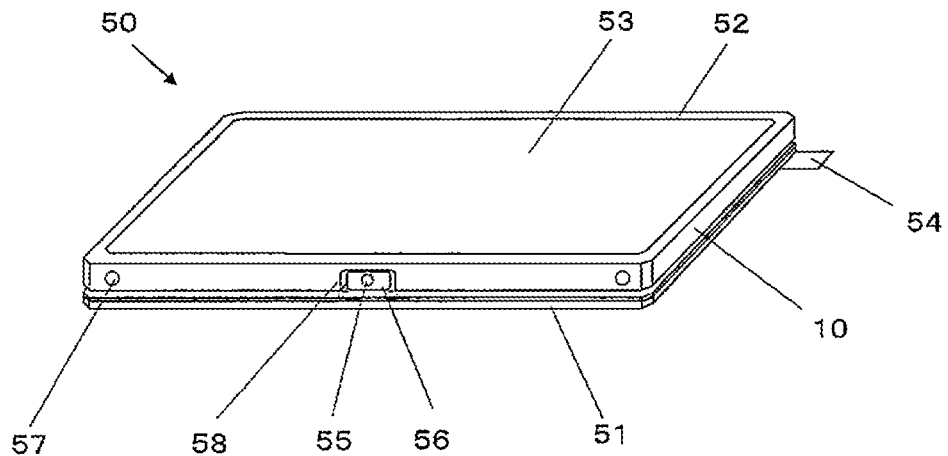
FIG. 5 A perspective view of a pellicle of the present invention.
Figure 6:
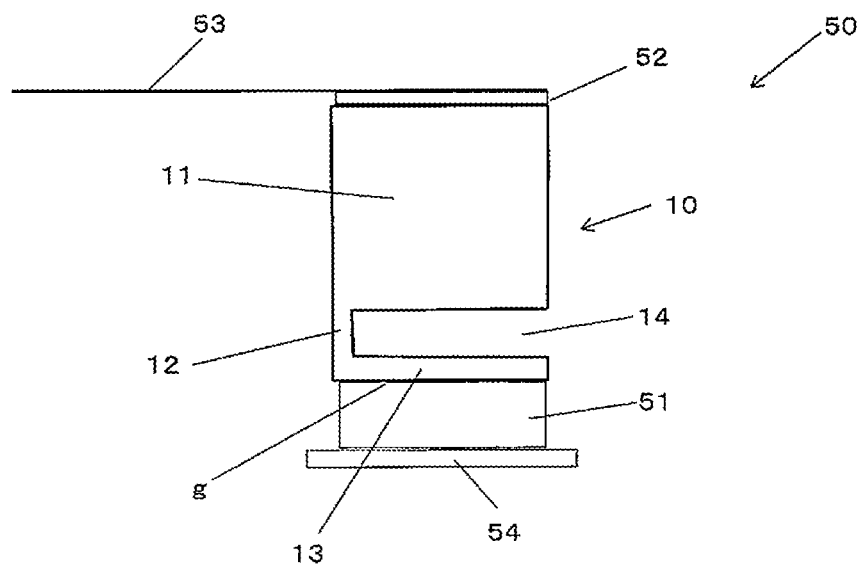
FIG. 6 A partial cross section of a pellicle of the present invention.

FIG. 5 is a perspective view of the pellicle 50, which is constructed using the pellicle frame 10 of the present embodiment, and FIG. 6 is a schematic cross section of a frame bar orthogonally cut about the place linked to the reference numeral 10. A mask-bonding agglutinant layer 51 is laid on the face g of the horizontally protruding part 13. This mask-bonding agglutinant layer 51 may be formed by directly applying an agglutinant made of an acrylic resin, a rubber resin, a silicone resin, a hot-melt resin or the like, or in place of it, it is possible to use a double coated adhesive tape, which consists of a base tape made of a flexible material such as foam and a thin adhesive layer coated on either side of the tape.

The mask-side surface of the agglutinant layer 51 may have a cross section of semicircular shape, but in order to allow a reduction of the necessary boding load it is preferable that the surface is made flat. Also from the viewpoint of minimizing the influence to the shape of the photomask induced by the pellicle adhesion thereto, the surface of the mask-bonding agglutinant layer 51 is preferably as planar as possible, and especially it is recommended that its flatness measure is in the range of 1-30 micrometers.

Usually, in order to protect this mask-bonding agglutinant layer 51, this layer is covered with a separator 54 which consists of a 50-300-micrometer-thick film of PET or the like and a releasing agent coated on either side of the film; however, the separator 54 can be omitted by adopting a specially designed pellicle container or a special preservation method, etc.

In the cases of the embodiments of FIG. 4, FIG. 5 and FIG. 6, the length of the horizontally protruding part 13 is equal to the width w1 of the pellicle frame main body 11 so that they are flush with each other outside; but this flush arrangement is not a requirement. The length of the part 13 is preferably determined based on the required boding area of the mask-bonding agglutinant layer 51 so that, for example, when a sufficient bonding strength is secured of the mask-bonding agglutinant layer 51 it is possible to shorten the protrusion of the part 13.

Also, the width w1 of the pellicle frame main body 11 can be determined freely so long as it meets the specification range. The width w1 can be different between the longer frame bars and the shorter ones; however, the width of the mask-bonding agglutinant layer 51 is preferable equal between the longer frame bars and the shorter ones. The reason for this is that if the width of the layer is different between the longer and the shorter frame bars, an inconvenience occurs in that the controlling of the press load values at the time of pellicle adhesion to the photomask becomes complicated.

It is also preferable that the inner wall face a of the pellicle frame 10 is coated with an adhesive material (not shown in Figs) such as an acrylic resin adhesive or a silicone resin adhesive so as to capture floating foreign particles. It is preferable too to provide a coating of a non-adhesive material (not shown either) such as an acrylic resin or a fluorine-based resin on the inner wall face only or on the entirety of the pellicle frame so as to prevent generation of foreign particles from the frame. The formation of the layers of these adhesive resin and non-adhesive resin may be performed by a conventional method such as spraying, dipping, powder coating or electro-deposition coating.

For the purpose of handling or the like, the outer face b of the pellicle frame 10 may be formed with jig holes 57, as shown in FIG. 5, and grooves (not shown) at appropriate locations. It is also propitious to give markings such as model No., serial No. or bar code to the frame by means of mechanical engraving or laser marking. Also, in order for the adjustment of the air pressure inside the pellicle after its adhesion to the photomask, it is possible to make a vent hole 55 through a pellicle frame bar, and for the purpose of preventing foreign particles from entering the pellicle's inside space, a thin filter 56 made of a porous material such as PTFE may be attached to cover the outer port of the vent hole 55. The attaching of the filter 56 may be performed by first providing an adhesive layer of an appropriate material to the outer wall face b of the pellicle frame 10 and fixing the filter 56 to the frame via the adhesive, or by first forming a counter bore 58 in the outer wall face b of the frame 10 and fixing the filter within the counter bore 56.

Figure 7:
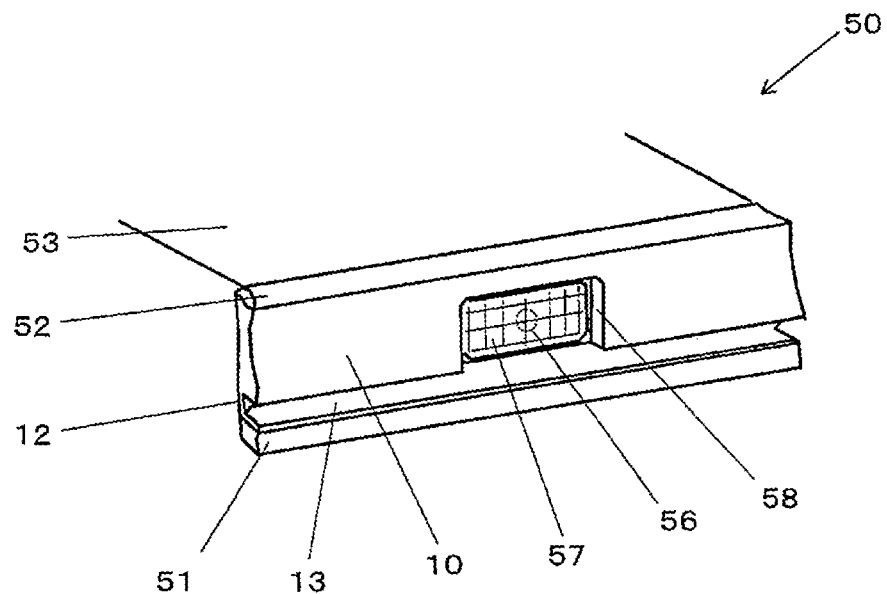
FIG. 7 A partial perspective view of a pellicle of the present invention, showing in particular an area including a filtered vent hole.

In the case of the embodiment of FIG. 7, showing an enlarged view, a part of the counter bore 58 opens into and merges with the hollow 14 formed between the pellicle frame main body 11 and the horizontally protruding part 13. The locations, the numbers and the shapes of the vent hole 55 and the filter 56 may be determined after taking into consideration the required ventilation degree and the convenience in handling.

The material for the pellicle membrane 53 may be selected from cellulose type resins, fluorine-containing resins, and the like depending on the kind of the exposure light source used, and the membrane thickness is to be selected from 0.1-10 micrometers in view of the transmittance, mechanical strength, etc., and it is possible to apply an antireflection layer if need be. The pellicle membrane-bonding adhesive layer 52 may be made of a conventional adhesive material such as an acrylic adhesive, a fluorine-containing adhesive, a silicone-based adhesive or the like.

Figure 8:
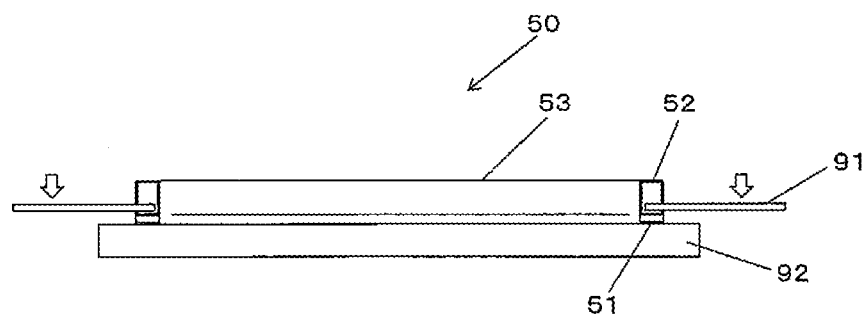
FIG. 8 A schematic cross sectional view, showing a pellicle of the present invention being bonded to a photomask.
Figure 10:
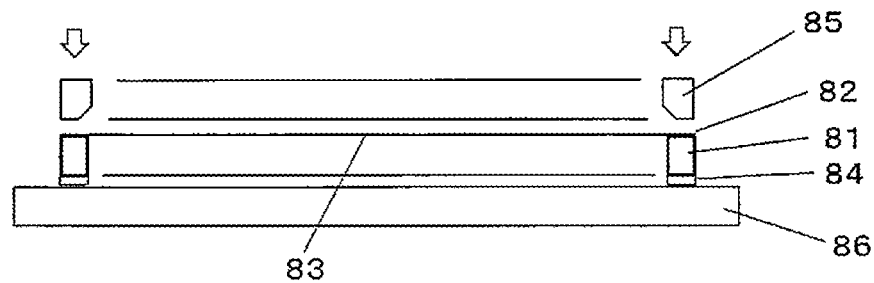
FIG. 10 A schematic cross sectional view showing how a conventional pellicle is bonded to a photomask.

A schematic cross sectional view showing a manner of pellicle adhesion operation according to the present invention is seen in FIG. 8; for the purpose of comparison a schematic cross sectional view showing a conventional manner of pellicle adhesion operation is shown in FIG. 10. Ordinarily, the pellicle adhesion to the photomask is conducted, as shown in FIG. 10, by applying a pressure to the pellicle membrane adhesive layer 82 by means of a frame-like pressing means 85. Thus applied pressure is transmitted through the pellicle frame 81 to the mask-bonding agglutinant layer 84, which is pressed against the photomask 86 whereby the adhesion (agglutination) is completed.

The pellicle 50 of the present invention can be adhered to the photomask in the conventional manner; but the adhesion is preferably effected in the following manner: first, as shown in FIG. 8, a pressing means 91 is inserted in the hollow formed between the horizontally protruding part 13 and the pellicle frame main body 11, and then the pressing means 91 is moved downward so that the pellicle is forced to be bonded to the photomask 92.

In this embodiment, the pressing means 91 is a completely flat piece, but from the viewpoint of rigidity and the like, it is possible to optimize by adopting a stepped piece having an increased overall thickness, or by folding back an edge. This pressing means 91 preferably has a sufficient rigidity, a flatness of at least 10 micrometers and a degree of parallelization of at least 20 micrometers relative to the photomask.

The pressing means 91 does not have to endlessly occupy the hollow 14 round about the entire pellicle frame 10; the occupation can be intermittent. Also, the pressing means 91 need be made up of at least two parts so that it can be attached to and detached from the pellicle before and after the adhesion operation, respectively; preferably, as shown in the plan view of FIG. 9, the pressing means 91 is composed of four parts or more parts, which are mounted on a means (not shown) which effects insertion and extraction of the respective parts of the pressing means 91 into and from the pellicle frame 10.

In the above-described embodiment of the present invention, the photomask 92 is held horizontally and the pellicle 50 is caused to approach it in a vertical direction to effect the adhesion, but it is also preferable to hold the photomask 92 vertically and to bring the pellicle 50 in a horizontal direction to effect the adhesion. In this way, although the apparatus for the adhesion becomes a little more complicated, it becomes easier to prevent gathering in of the foreign particles at the time of the adhesion, and also the bowing of the photomask by its own weight can be prevented.

The magnitude of the pressure required for the adhesion of the pellicle is smaller, if the flatnesses of the photomask and the pellicle (and the photomask-bonding agglutinant layer) are smaller (better), or if the difference among the surface shapes of them is smaller. The magnitude of the pressure required for the adhesion can also be reduced if the flexibilities of the pellicle frame and the mask-bonding agglutinant layer are higher. The smaller is the pressure required to effect the adhesion, the smaller the deformation of the photomask at the time of the adhesion can be, and also smaller the eventual deformation of the photomask at the end of the adhesion will be.

In the present invention, the horizontally protruding part 13, on which the mask-bonding agglutinant layer 51 is laid, is flexible so that when the part 13 is directly pressed by the pressing means 91, the mask-bonding agglutinant layer 51 can be caused to closely adhere to the surface of the photomask 92. Also, a desired adhesive strength (agglutinant strength) is secured and at the same time, thanks to the small pressure magnitude, the deformation the photomask 92 undergoes is restricted small.

Furthermore, since the mask-bonding agglutinant layer 51 and the pellicle frame main body 11 are connected via the flexible protruding parts 12, 13, the influence arising from the difference between the face contour of the pellicle frame main body 11 and that of the photomask 92 is mitigated, and all in all the deformation of the photomask after the adhesion thereto of the pellicle 50 becomes very small.

As described above, in this embodiment of the present invention, the mask-bonding agglutinant layer 51 is laid on the less rigid body of the horizontally protruding part 13, which is formed to extend, via the vertically protruding part 12, from the face d of the pellicle frame main body 11, which is on the side of the photomask 92, so that the mask-bonding agglutinant layer 51 readily deforms to fit and copy the contour of the photomask 92 with a result that the negative influence of the shape of the pellicle frame main body 11 is mitigated, and thus the deformation of the photomask induced by the adhesion of the pellicle 50 is substantially suppressed. Also, since the horizontally protruding part 13, on which the photomask-bonding agglutinant layer 51 is laid, is directly pressed to effect the adhesion, it is possible to substantially reduce the load imposed for the adhesion, so that the deformation of the photomask 92 caused by the adhesion operation can be minimized.

Also in the embodiment of the present invention, since the ability of the agglutinant layer to readily fit and copy the contour of the photomask 92 is improved, the need to reduce the height of the pellicle frame main body 11 (that is, to reduce its rigidity) is lessened, so that the pellicle's function of defocusing the foreign particles can be maintained as before. Also, the rigidity of the pellicle frame main body 11 is secured so that there would be fewer problems during manufacturing and use.

The pellicle of the present invention can replace any pellicle which has a problem of inducing deformation to the photomask as it is adhered thereto; the effect of the present invention is felt stronger when it is applied to pellicles for the manufacture of the up-to-date semiconductor products.

Example

Here an Example of the present invention will be explained in concrete, but the scope of the invention is not limited by it.

First a pellicle frame 10 having an appearance as indicated in FIGS. 1 through 4 was prepared. This pellicle frame 10 was cut out by machining from a body of aluminum alloy A7075 and had an external dimension of 149 mm×115 mm and a height of 5.5 mm. The width w1 of the pellicle frame main body 11 was 1.9 mm, the width w2 of the vertically protruding part 12 was 0.3 mm, the width w3 of the horizontally protruding part 13 was 0.3 mm, the distance w4 between the pellicle main body 11 and the horizontally protruding part 13 was 0.8 mm, and this cross-sectional construction was also adopted for the corners.

Also, as shown in FIG. 5, in the middle part of a longer bar of the pellicle frame 10 are formed a penetrating vent hole 55 having a diameter of 0.5 mm and a counter bore 58 to surround the former; and in the vicinity of the frame corners a non-penetrating jig hole 57 for pellicle handling is formed at either end of the longer bars. All around the pellicle frame the edge lines were chamfered by C:0.1 mm-C:0.2 mm (not shown); the entire surface of the frame was subjected to sand blasting to an extent that its Ra value became about 0.6, and then the surface received black color alumite treatment. In the end, the pellicle frame was inspected for its various sizes and was given some corrective treatment; thereafter the flatness of the face g to receive the mask-bonding agglutinant layer 51 was found 20 micrometers.

Incidentally the "flatness" of pellicle frame is obtained by the following method: the height of the frame is measured at eight locations, namely four corners and four middle points of the frame bars; an imaginary occlusal plane is calculated out; then the distance of each measurement point from the occlusal plane is calculated, and the flatness is the difference between the greatest distance and the smallest distance. The flatness of the pellicle frame may be measured by a "laser displacement meter having XY-axis program stage"; in the present invention a displacement meter made by the inventor's company was used.

Next, using this pellicle frame 10, a pellicle 50, as shown perspectively in FIG. 5 and cross-sectionally in FIG. 6 was made. The following procedure was conducted for the making.

The pellicle frame 10 was thoroughly washed with a surface-active agent and pure water, and then dried. As the mask-bonding agglutinant a silicone agglutinant (KR3700, a product name of Shin-Etsu Chemical Co., Ltd.) and as the pellicle membrane-bonding adhesive a fluorine-containing resin (CYTOP, a product name of ASAHI GLASS CO., LTD.) were, respectively, laid on the face g of the horizontally protruding part 13 and the membrane-bonding face c of the frame by means of an air pressure type dispenser mounted on an orthogonal tri-axial robot; then the solvents of the glues were eliminated by drying and the glues were cured by heating at 130 degrees C. so as to form the mask-bonding layer 51 and the pellicle membrane-bonding adhesive layer 52, respectively. Prior to the elimination of the solvent, the surface of the mask-bonding agglutinant 51 was flattened by being pressed by a glass plate, which had been polished to a flatness of 0.3 micrometer, and its resultant thickness was 0.5 mm and the surface flatness was 10 micrometers.

Then for the protection of the surface of the mask-bonding agglutinant layer 51, a separator 54, which was a 125-micrometer-thick film of PET coated with a releasing agent, was laid over the agglutinant layer 51. Next, a filter 56 consisting of a PTFE porous film was glued with an acrylic adhesive so as to cover up the vent hole 55 made in the middle of a longer frame bar. As shown in FIG. 7, the filter 56 was embedded in the counter bore 58.

A fluorine-containing resin (CYTOP, a product name of ASAHI GLASS CO., LTD.), as the material to make the pellicle membrane 53, was made into a membrane by spin coating method on a membrane-making plate (a 300-mm diameter silicon wafer), and after eliminating the solvent by drying, the membrane was transferred from the membrane-making plate to a temporary frame having the same external dimension as the membrane-making plate, by adhering the temporary frame to the membrane and tearing it from the plate; thus obtained membrane had a thickness of 0.28 micrometer. This membrane was adhered to the pellicle membrane-bonding layer 52 on the pellicle frame 10 to become the pellicle membrane 53, and the excessive part of the membrane which extended beyond the outer extremity of the pellicle frame 10 was trimmed off by a cutter whereby the pellicle 50 was completed.

Figure 9:
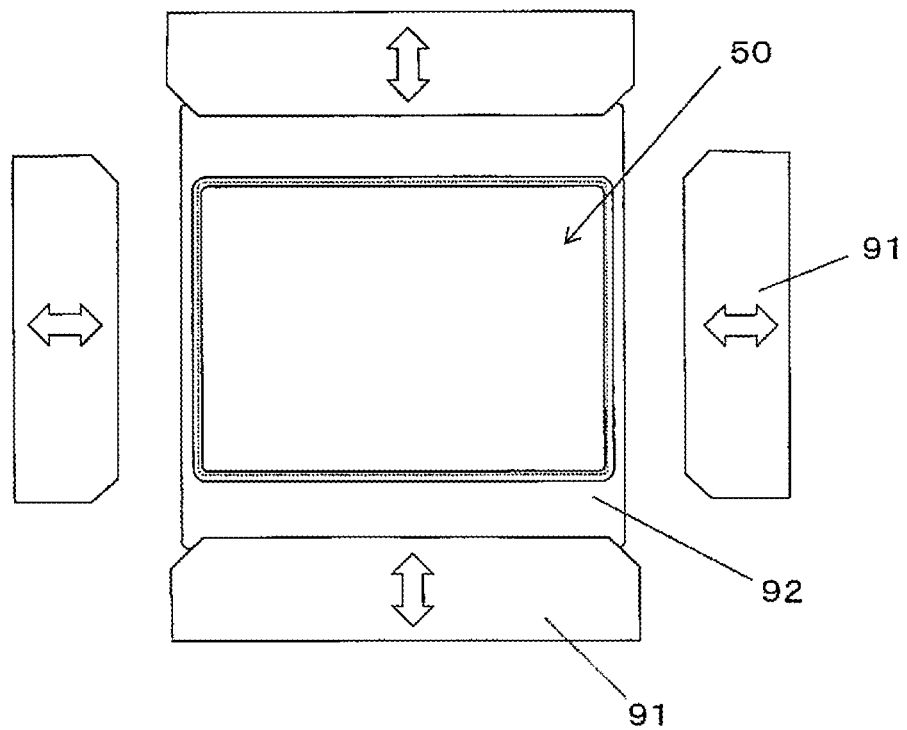
FIG. 9 A schematic plan view showing a pellicle about to be bonded to a photomask.

The completed pellicle 50 was adhered to the photomask 92 in the manner as indicated in FIG. 8. In this case, the pressing means 91 was in a shape of flat plate and consisted of four parts, as shown in FIG. 9. Each part of the pressing means 91 was mounted on a respective directly driven type guide mechanism (not shown), and was moved by a drive means (not shown) in a respective direction indicated by the respective arrow in FIG. 9, whereby the fore end section of respective part of the pressing means 91 was either inserted in or removed from the hollow 14 of the pellicle frame 10.

Also, the parts of the pressing means 91 were cut from stainless steel SUS 304 by machining and they were polished to a flatness of 10 micrometer or better, and were positioned such that the parts 91 had a degree of interfacial parallelization of at least 20 micrometers relative to the photomask 92.

Next, a photomask 92 made of a quartz and having a dimension of 150 mm×150 mm and a thickness of 6 mm and a flatness of 0.3 micrometer was prepared and to this the pellicle 50 was adhered by the pressing means. On this occasion, the pressure for the adhesion was 2 kgf and the pressing time was 10 minutes.

After its adhesion to a photomask base plate, the adhesion result of the mask-bonding agglutinant layer 51 was inspected by eye through the back face of the photomask 92, and it was found that the adhesion was effected by a constant width all around the pellicle frame to a satisfactory degree. Then, the flatness of this photomask base plate coupled with the pellicle was measured, and the flatness was found to be maintained as small as 0.32 micrometer as opposed to its pre-bonding flatness of 0.3 micrometer.

COMPARATIVE EXAMPLES

Comparative Example 1

In Comparative Example 1, adopting exactly the same procedure as in the above-described Example, a pellicle frame having an external dimension of 149 mm×115 mm, an internal dimension of 145.2 mm×111.2 mm, and a height of 5.5 mm was prepared by machining. Next, a vent hole having a diameter of 0.5 mm was made through in the middle of a longer frame bar of the pellicle frame; also non-penetrating jig holes were made in the outer wall of each one of the pellicle frame bars near the frame corners for handling operation. Furthermore, all around the pellicle frame the edge lines were chamfered by about C:0.1 mm-0.2 mm; the entire surface of the frame was subjected to sand blasting to an extent that its Ra value became about 0.6; and then the surface received black color alumite treatment.

The difference between this Comparative Example 1 and the afore-described Example lies in that the former lacks the latter's vertically protruding part 12, horizontally protruding part 13 and counter bore 58, which surrounds the vent hole. The flatness of the mask-bonding agglutinant layer-side face of the pellicle frame of this Comparative Example 1 was measured and it was 20 micrometers.

Next, using this pellicle frame, a pellicle was completed by going through exactly the same procedure as in the Example, and the mask-bonding agglutinant layer of this completed pellicle was measured—as a part of estimation of suitability for the subsequent adhesion to the photomask—in the same manner as in the Example and its thickness was 0.5 mm and its flatness was 10 micrometers.

FIG. 10 is a schematic cross sectional view at the time of the pellicle adhesion operation. The pressing means 85 was caused to impart a pressure to the mask-bonding agglutinant layer 84 via the pellicle membrane-bonding adhesive layer 82 to which the pellicle membrane 83 was adhered and via the pellicle frame 81, whereby the adhesion to a photomask 86 was effected. The photomask 86 used in this test was equivalent to the one used in the Example, that is, it was made of the quartz and had a dimension of 150 mm×150 mm and a thickness of 6 mm and a flatness of 0.3 micrometer; the pressure applied was 5 kgf and the pressing time was 10 minutes.

After the adhesion, the adhesion result of the mask-bonding agglutinant layer 84 was inspected by eye through the back face of the photomask 86, and it was found that in the vicinity of one of the four corners there was an about 30% narrowing in the width of the agglutinant across which the contact between the agglutinant layer and the photomask 86 was effected, so that there occurred a modicum concern regarding its reliability in a long term use. Then, the flatness of this photomask base plate coupled with the pellicle was measured, and the flatness was found to be 0.38 micrometer as opposed to its pre-bonding flatness of 0.3 micrometer, which was a clearly poor result when compared with the 0.32 micrometer in the case of the Example.

Comparative Example 2

In Comparative Example 2, a pellicle frame of which the frame bars have a cross section of letter I shape, as is described in IP Publication 2, was used. First, adopting exactly the same procedure as in the above-described Example, a pellicle frame having an external dimension of 149 mm×115 mm, a height of 3.2 mm and a width of 1.9 mm was prepared by machining. The cross section of the frame bars of this pellicle frame was made to have the letter I shape, and was so made by removing, as viewed in the cross section, a 2.2-mm-high-and-0.6-mm-wide rectangular part from both of the longer sides of the 3.2-mm-high-and-1.9-mm-wide rectangle in a manner such that the horizontal center lines of these rectangles coincide with each other; as can be calculated, the resultant cross section of the frame bars is such that the top and base parts had a thickness of 0.5 mm and the central (standing) part had a thickness of the 0.7 mm.

In this Comparative Example 2, warping was observed to have occurred in the entire body of the pellicle frame after each of the steps, namely, inside faces machining, outside faces machining and alumite treatment, so that between the respective steps a suitable correction of the flatness of the pellicle frame was performed on a surface plate. After the completion of the pellicle frame, the flatness of the mask-bonding agglutinant layer-side face of this pellicle frame was measured and it was 20 micrometers.

Next, using this pellicle frame, a pellicle was completed by going through exactly the same procedure as in the Example, and the mask-bonding agglutinant layer of this completed pellicle was measured—as a part of estimation of suitability for the subsequent adhesion to the photomask—in the same manner as in the Example and its thickness was 0.5 mm, which was the same as in the case of Example, but the flatness was 65 micrometers, which was a considerable degradation as compared to the 20 micrometers, which was the flatness of the mask-bonding agglutinant layer-side face of the pellicle frame before laying of the agglutinant layer.

The cause for this was investigated, and it was found that the deformation took place during the steps of handling and curing of the agglutinant layer, which latter was conducted by heating the layer at 130 degrees C. However, as it is impossible to correct the flatness after the pellicle is completed, the pellicle without receiving the correction was adhered to the photomask for the estimation.

Then, after the adhesion to a photomask base plate, the adhesion result of the mask-bonding agglutinant layer was inspected by eye through the back face of the photomask, and it was found that the adhesion was effected by a constant width all around the pellicle frame. However, the flatness of this photomask base plate coupled with the pellicle was 0.36 micrometer as opposed to its pre-bonding flatness of 0.3 micrometer, which was a clearly poor result when compared with the 0.32 micrometer in the case of the Example.

REPRESENTATION OF REFERENCE NUMERALS

10: pellicle frame
11: pellicle frame main body
12: vertically protruding part
13: horizontally protruding part
14: hollow between the horizontally protruding part and the pellicle frame main body
a: inner wall face
b: outer wall face
c; membrane-bonding face
d: lower face of the pellicle frame main body
e: one face of vertically protruding part
f: one face of horizontally protruding part
g: mask-bonding agglutinant receiving face
50: pellicle
51: mask-bonding agglutinant layer
52: pellicle membrane-bonding adhesive layer
53: pellicle membrane
54: separator
55: vent hole
56: filter
57: jig hole
58: counter bore
81: pellicle frame 82: pellicle membrane-bonding adhesive layer
83: pellicle membrane
84: mask-bonding agglutinant layer
85: pressing means
86: photomask
91: pressing means
92: photomask Scopes of what is claimed:

1. A pellicle frame built of a framework characterized by comprising, at least in part: a pellicle frame main body having a pellicle membrane-receiving face, on which a pellicle membrane is tensely adhered, and an inner wall face; a vertically protruding part which extends vertically from that face of the pellicle frame main body which is opposite to said pellicle membrane-receiving face, said vertically protruding part having a thickness of 5-30% of a horizontal width of the pellicle frame main body; and a horizontally protruding part which extends in parallel to and below said pellicle membrane-receiving face from a distal part of said vertically protruding part, said horizontally protruding part having a thickness of 0.3-1 mm; and said vertically protruding part and said horizontally protruding part have respective faces which are flush with said inner wall face of the pellicle frame main body.

2. A pellicle frame as claimed in claim 1, further characterized by that said inner wall face of the pellicle frame main body, said respective faces of the vertically protruding part and the horizontally protruding part which are flush with said inner wall face of the pellicle frame main body are normal to said membrane-receiving face of the pellicle frame main body.

3. A pellicle frame as claimed in claim 1, characterized by that a distance between said horizontally protruding part and said pellicle frame main body is in a range of 0.3 through 3 mm.

4. A pellicle frame as claimed in claim 1, characterized by that said vertically protruding part and said horizontally protruding part constitute a monolithic body together with said pellicle frame main body.

5. A pellicle comprising: (i) a pellicle frame constituted, at least in part, by a pellicle frame main body having a pellicle membrane-receiving face, on which a pellicle membrane is tensely adhered, and an inner wall face; a vertically protruding part which extends vertically from that face of the pellicle frame main body which is opposite to said pellicle membrane-receiving face, said vertically protruding part having a thickness of 5-30% of a horizontal width of the pellicle frame main body; and a horizontally protruding part which extends in parallel to and below said pellicle membrane-receiving face from a distal part of said vertically protruding part, said horizontally protruding part having a thickness of 0.3-1 mm; and said vertically protruding part and said horizontally protruding part have respective faces which are flush with said inner wall face of the pellicle frame main body, and (ii) a mask-bonding agglutinant layer which is laid on a face of said horizontally protruding part.

6. A pellicle as claimed in claim 5 characterized by that a flatness of said mask-bonding agglutinant layer is 1 through 30 micrometers.

7. A pellicle as claimed in claim 5, characterized by that said inner wall face of the pellicle frame main body, said respective faces of the vertically protruding part and the horizontally protruding part which are flush with said inner wall face of the pellicle frame main body are normal to said membrane-receiving face of the pellicle frame main body.

8. A pellicle as claimed in claim 5, characterized by that a distance between said horizontally protruding part and said pellicle frame main body is in a range of 0.3 through 3 mm.

9. A pellicle as claimed in claim 5, characterized by that said vertically protruding part and said horizontally protruding part constitute a monolithic body together with said pellicle frame main body.

10. A method for adhering a pellicle onto a photomask, wherein said pellicle comprises, at least in part: (i) a pellicle frame constituted by a pellicle frame main body having a pellicle membrane-receiving face, on which a pellicle membrane is tensely adhered, and an inner wall face; a vertically protruding part which extends vertically from that face of the pellicle frame main body which is opposite to said pellicle membrane-receiving face, said vertically protruding part having a thickness of 5-30% of a horizontal width of the pellicle frame main body; and a horizontally protruding part which extends in parallel to and below said pellicle membrane-receiving face from a distal part of said vertically protruding part, said horizontally protruding part having a thickness of 0.3-1 mm; and said vertically protruding part and said horizontally protruding part have respective faces which are flush with said inner wall face of the pellicle frame main body, and (ii) a mask-bonding agglutinant layer which is laid on a face of said horizontally protruding part;

said method being characterized by that a pressing means is inserted between said horizontally protruding part and said pellicle frame main body and said pressing means is caused to press said horizontally protruding part in a direction such that said mask-bonding agglutinant layer is pressed against the photomask.

* * * * *